(12) United States Patent
Lee

(10) Patent No.: US 8,030,699 B2
(45) Date of Patent: Oct. 4, 2011

(54) FLASH MEMORY DEVICE

(75) Inventor: Jong-ho Lee, Daegu (KR)

(73) Assignee: SNU R&DB Foundation, Seoul (KR)

( * ) Notice: Subject to any disclaimer, the term of this patent is extended or adjusted under 35 U.S.C. 154(b) by 327 days.

(21) Appl. No.: 11/918,967

(22) PCT Filed: Apr. 21, 2006

(86) PCT No.: PCT/KR2006/001509
§ 371 (c)(1),
(2), (4) Date: Feb. 10, 2009

(87) PCT Pub. No.: WO2006/112683
PCT Pub. Date: Oct. 26, 2006

(65) Prior Publication Data
US 2009/0212344 A1    Aug. 27, 2009

(30) Foreign Application Priority Data

Apr. 22, 2005    (KR) .......................... 10-2005-0033631

(51) Int. Cl.
*H11L 29/788*    (2006.01)
(52) U.S. Cl. ................................. 257/316; 257/E29.129
(58) Field of Classification Search .................. 257/315, 257/316, 321, E29.129, E29.3, E29.304, 257/E21.209, 413
See application file for complete search history.

(56) References Cited

U.S. PATENT DOCUMENTS

| | | | |
|---|---|---|---|
| 5,237,196 A * | 8/1993 | Mikata et al. .................. 257/409 |
| 5,923,056 A * | 7/1999 | Lee et al. ....................... 257/192 |
| 6,287,915 B1 * | 9/2001 | Muramatsu .................... 438/257 |
| 6,649,965 B2 * | 11/2003 | Takada et al. .................. 257/314 |
| 6,693,009 B1 | 2/2004 | Kim et al. |
| 6,720,610 B2 * | 4/2004 | Iguchi et al. ................... 257/315 |
| 6,765,258 B1 | 7/2004 | Wu |
| 6,998,675 B2 * | 2/2006 | Weimer .......................... 257/321 |
| 7,355,242 B2 * | 4/2008 | Sumino et al. ................. 257/315 |
| 2005/0009274 A1 * | 1/2005 | Dong ............................. 438/257 |
| 2005/0079662 A1 * | 4/2005 | Miki .............................. 438/200 |

FOREIGN PATENT DOCUMENTS

| | | |
|---|---|---|
| JP | 10189921 | 7/1998 |
| JP | 11150195 | 6/1999 |

OTHER PUBLICATIONS

"Effects of Buffer Layer Structure on Polysilicon Buffer LOCOS for the Isolation of Submicron Silicon Devices" Jong-Ho Lee, et al., IEEE Transactions on Electron Devices, vol. 45, No. 10, Oct. 1998, pp. 2153-2160.

* cited by examiner

*Primary Examiner* — Mark Prenty
(74) *Attorney, Agent, or Firm* — Harness, Dickey & Pierce, PLC

(57) ABSTRACT

Disclosed herein is a flash memory device in which the distribution of threshold voltage is significantly reduced and the durability is improved even though a floating gate has a micro- or nano-size length. It comprises a tunneling insulation film formed on a semiconductor substrate; a multilayer floating gate structure comprising a first thin storage electrode, a second thick storage electrode, and a third thin storage electrode, defined in that order on the tunneling insulation film; an interelectrode insulation film and a control electrode formed in that order on the floating gate structure; and a source/drain provided in the semiconductor substrate below the opposite sidewalls of the floating gate structure. The novel flash memory device can be readily fabricated at a high yield through a process compatible with a conventional one.

4 Claims, 8 Drawing Sheets

[Fig. 1]
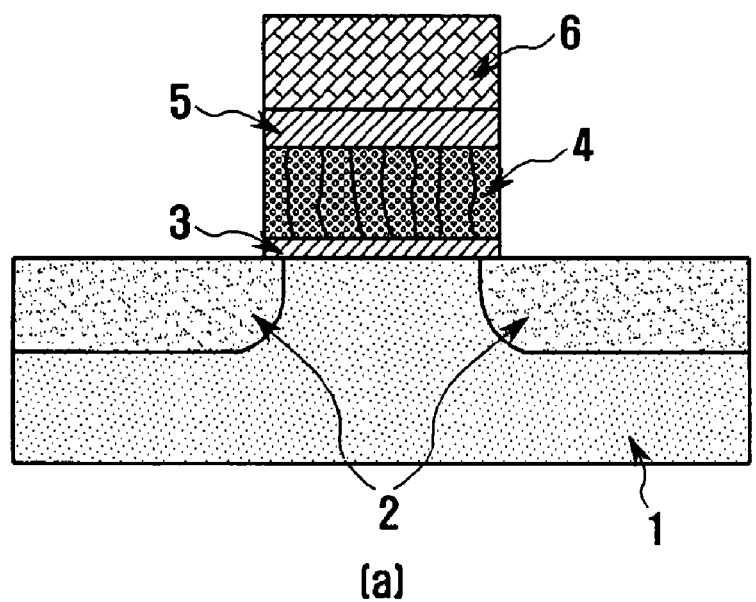
(a)
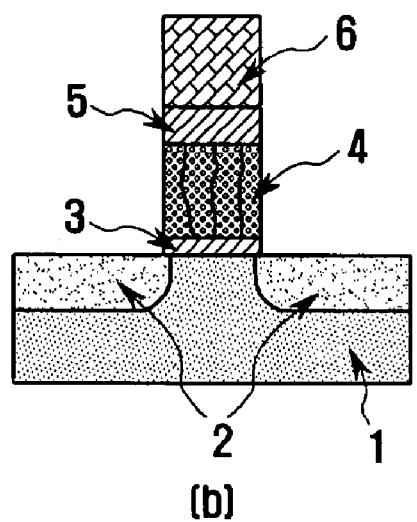
(b)

[Fig. 2]
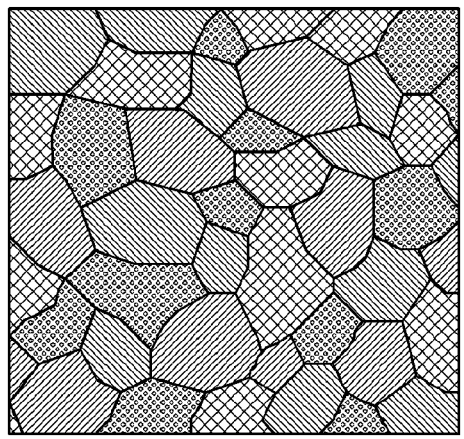
(a)
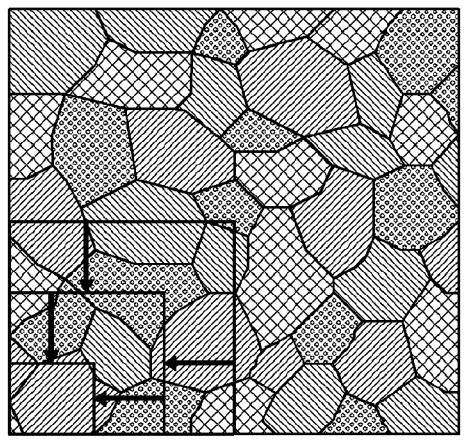
(b)
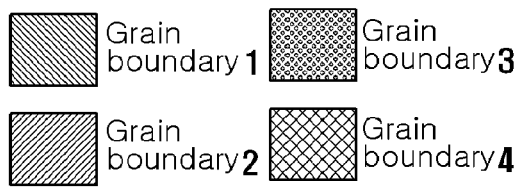
Grain boundary 1
Grain boundary 2
Grain boundary 3
Grain boundary 4
[Fig. 3]
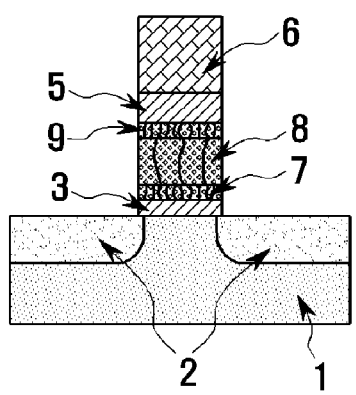

[Fig. 4]
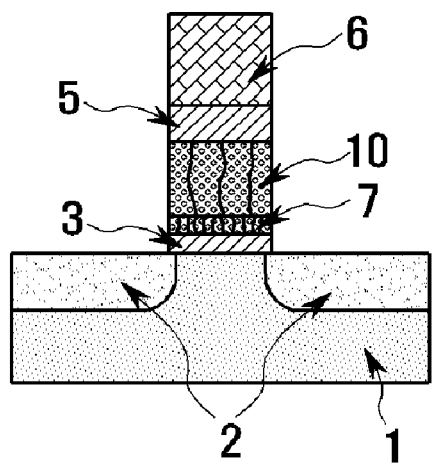
[Fig. 5]
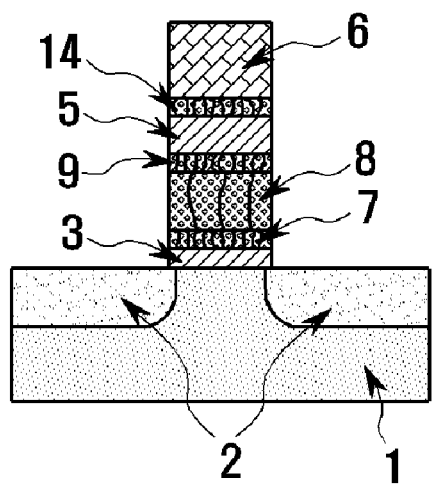
[a]
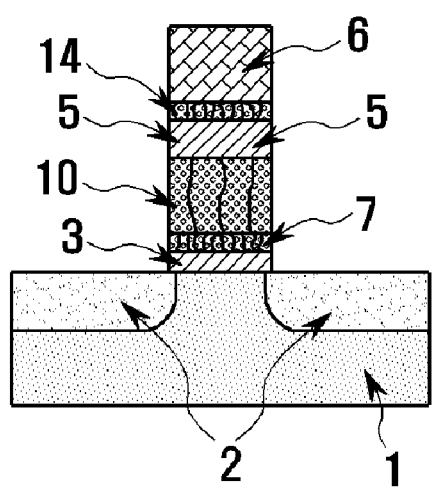
[b]

Fig. 6
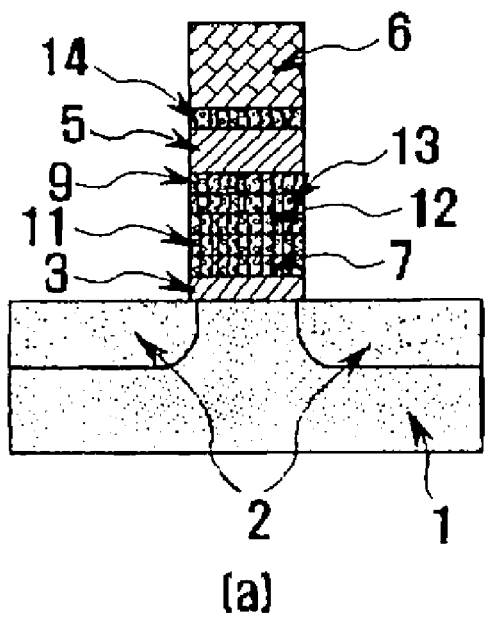
(a)
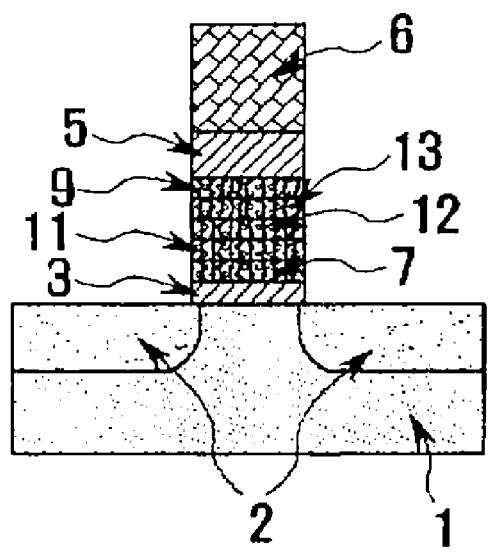
(b)

Fig. 7
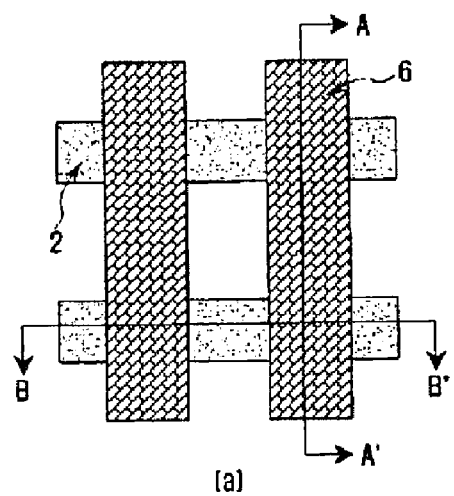
[a]
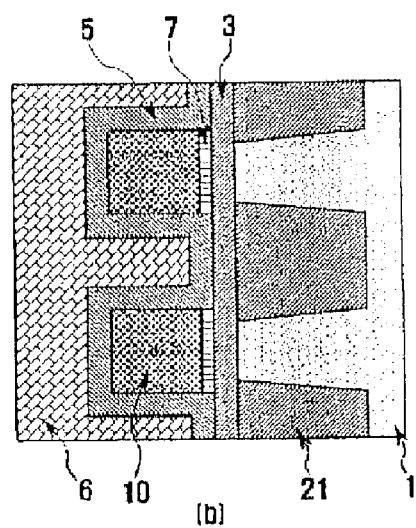
[b]
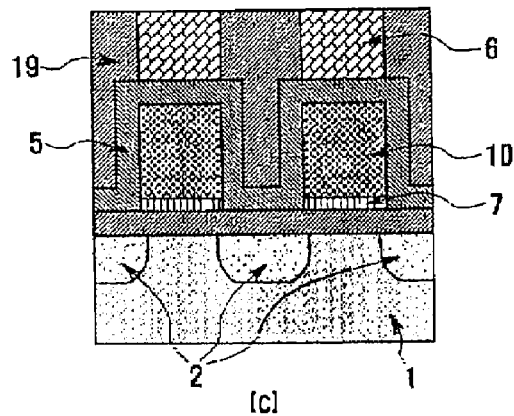
[c]

Fig. 8
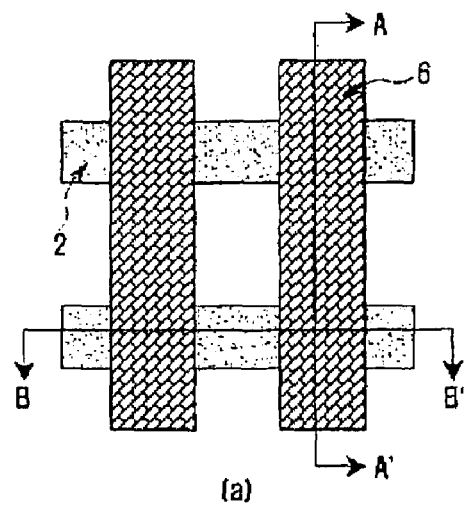
(a)
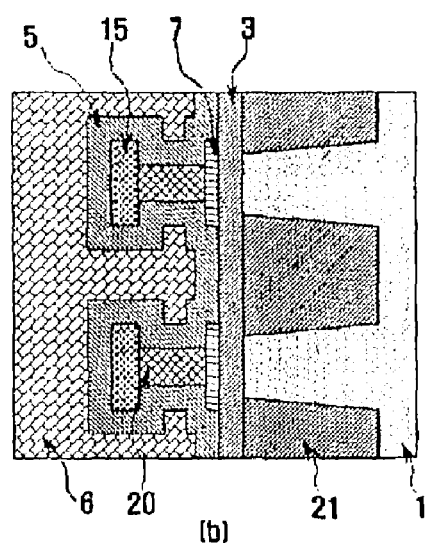
(b)
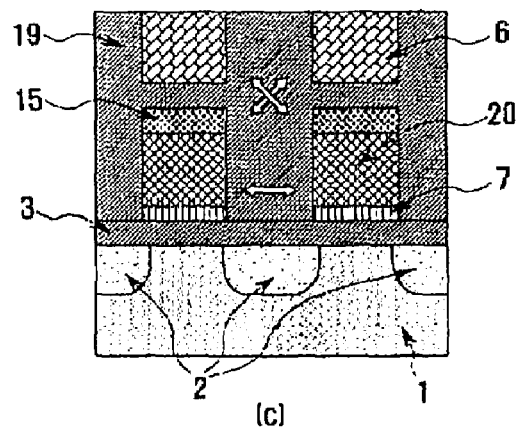
(c)

Fig. 10
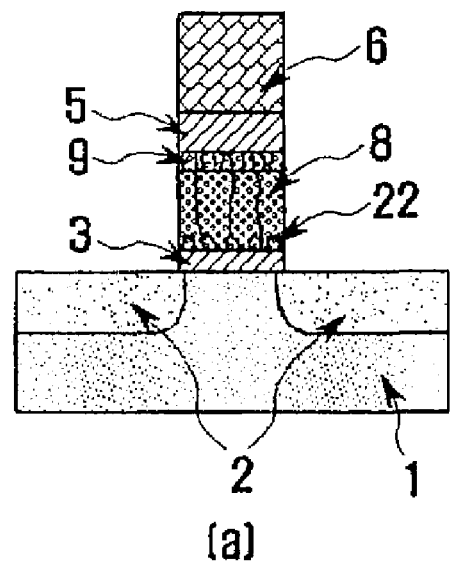
(a)
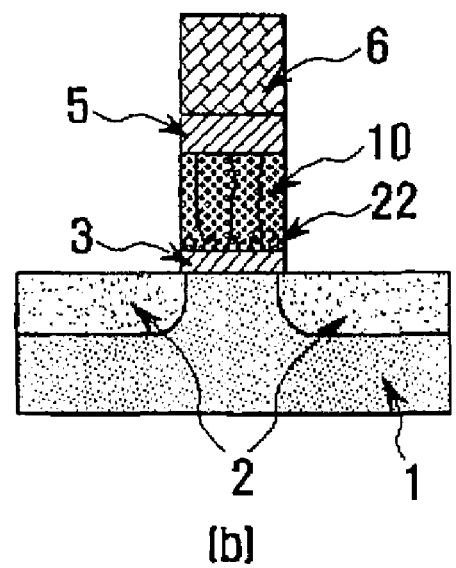
(b)

FLASH MEMORY DEVICE

TECHNICAL FIELD

The present invention relates, in general, to a flash memory device and, more particularly, to a flash memory device having a novel floating gate structure capable of decreasing the distribution of threshold voltage and improving the durability thereof despite having a micro- or nano-size gate length.

BACKGROUND ART

As seen in FIG. 1, a conventional flash memory device, such as that fabricated by Toshiba in Japan, or the ETOX flash memory device of Intel in the U.S.A., comprises a planar channel on which an insulation film 3, a floating gate (or storage electrode) 4, an inter-electrode insulation film 5, and a control electrode 6 are laminated in that order. With the recent great advances in various electronic appliances and mobile electronic equipment, the degree of integration of memory devices has been required to increase. Even though the memory size can be increased from a given technology node by applying an MLC (Multi Level Cell) technique, the size of the nonvolatile flash memory device must be reduced. However, the size reduction of the flash memory device may cause a lithographic problem, leading to the incapability to precisely control the size of a CD (Critical Dimension), and thus to CDE (CD Error).

In addition, as one cell element becomes close to another, cross-talk occurs therebetween, causing an operational error of the memory device and an increase in threshold voltage distribution. The narrower the distribution of threshold voltages according to the writing/erasing operation of cell elements, the better. However, the above-mentioned problems increase as the memory device decreases in size. Thus, the production yield also decreases. Particularly, as shown in FIG. 2, the floating electrode is made from polysilicon, consisting of a plurality of grains which differ in direction from one to another. In the case where a gate has a large area, that is, in the case in which the degree of integration is low, a number of grains which are variable in crystal direction exist in one cell storage electrode, so that the characteristics of the grains are equalized in each cell element. That is, none of the grains in a particular grain direction are predominant over any other, resulting in an improvement in the uniformity of characteristics over cell elements.

Despite the recent requirement for a high degree of integration, the thickness of the floating gate of the cell element has not tended to decrease because the coupling ratio between the control electrode and the floating electrode (or gate) must be maintained at approximately 0.6 or greater. Because the height of the floating gate has not decreased despite the size reduction of memory devices, cross-talk based on parasitic capacitance between cell elements has increased and the grain size has not decreased. As the cell elements decrease in size, the structure thereof is highly apt to undergo mechanical stresses from various thin films deposited thereon.

Suggested in the present invention is a structure which comprises simple elements and which can be fabricated through a process that is compatible with a conventional one, and which can solve the problems encountered in the prior arts, that is, can exhibit a narrow threshold voltage distribution, reduced cross-talk, and decreased mechanical stresses. If the floating gate decreases in thickness according to the miniaturization of cell elements, the coupling ratio is reduced. An attempt has been made to maintain the coupling ratio while reducing the thickness of the floating gate.

U.S. Pat. No. 6,765,258B1 (entitled "Stack-gate flash memory cell structure and contactless flash memory arrays therefor") employs a spacer formation technology to realize a floating-gate structure with a thinner floating-gate layer formed in a center and a thicker floating-gate layer formed at the edge. This floating-gate structure requires additional spacer formation technology and is still likely to exhibit increased cross-talk with the adjacent cell due to the large thickness of the edge of the floating gate. This floating gate structure is different from that of the present invention, and does not exhibit excellence in terms of effect or process.

Even though the method is different than that of the present invention, a flash memory device having reduced cross-talk between neighboring cells is disclosed in U.S. Pat. No. 6,693,009B1 (entitled "Flash memory cell with minimized floating gate to drain/source overlap for minimizing charge leakage"). Out of a stack of a control electrode and a floating electrode, formed using a given technology node, only the floating electrode is laterally etched away to form an undercut, thereby suggesting a structure with a (reduced floating to drain/source overlap?). In this structure, charge leakage from the floating gate is minimized during programming/erasing of the flash memory cell. However, the device in this structure may operate erroneously because the undercut at the sidewall may eliminate the overlap between the source/drain and the floating gate. With regard to the object of minimizing only the floating gate to drain/source overlap, the length of the overlap can be precisely controlled by source/drain ion implantation into a dummy spacer rather than by etching a sidewall of the floating gate.

One of the advantages from the multilayer floating gate structure of the present invention is the improvement of the durability of the memory device by effectively absorbing mechanical stresses onto the grain boundary of polysilicon, the area of which is increased as a multilayer structure is formed. In this context, the advantages of such a multilayer structure can be found in the literature. An article issued in IEEE Trans. on Electron Devices, October 1998 (entitled "Effects of buffer layer structure on polysilicon buffer LOCOS for the isolation of submicron silicon devices") sheds light on polysilicon buffered LOCOS, a conventional element isolation technology. In the article, problems, such as the formation of pin holes, caused by mechanical stresses can be solved by employing a multiple polysilicon layer, instead of a single polysilicon layer, as a buffer layer.

Flash memory devices are in great demand as household appliances and mobile electronic devices develop rapidly. Flash memory devices having gates 100 nm long have been developed and are now produced on an industrial scale. Mass production is expected for 60-nm process flash memory devices, which is beyond a 70-nm process, in the near future. Particularly, NAND type flash memory devices are expected to be developed using a 45 nm process. Major problems accompanying the reduction in gate length include the distribution of threshold voltage of the device which conducts programming/erasing processes, and cross-talk between the cell elements thereof. A decrease in gate length means a reduction in the size of the patterns formed through a lithographic technique. Problems with the photolithography and etching processes for reducing the size of patterns bring about errors into the critical dimension, causing a large distribution of device characteristics within and between wafers and between lots.

Particularly, threshold voltages after programming/erasing must be uniform, but show a large distribution in practice, resulting in a decrease in production yield. The distribution of threshold voltage is a variable which must be controlled because it has great importance for a flash memory device process. The distribution of threshold voltage, as mentioned above, generally increases with the reduction of device size. One of the factors determining the increase is the grain size of a polysilicon storage electrode. While the area of a storage electrode decreases with the reduction of device size, polysilicon grains are not reduced in size in the storage electrode. Accordingly, grains of a polysilicon storage electrode tend to decrease in number as the cell elements are decreased in size. Generally, only one to several grains exist in one cell on a 70-nm technology node. A polysilicon storage electrode consists of a plurality of grains, crystal directions of which are randomly formed. If different in crystal direction, grains differ from one to another in interface charge thereof at boundaries with tunneling insulation films immediately below. In the case of a storage electrode having a large area, there are a number of grains that have various crystal directions. Thus, each cell element has a storage electrode in which a variety of interface charges from various grains are averaged, so that interface charge characteristics are uniform over the cells.

However, grains within the storage electrode decrease in number as the cell decreases in size, increasing the possibility that grains in a particular direction will be predominant over grains in other directions. This results in a decrease in the uniformity of threshold voltage between cells. In other words, the distribution of threshold voltage increases. In this way, conventional flash cell devices have an increased distribution of threshold voltage as they decrease in size.

Further, the polysilicon floating gate of the conventional flash device structure does not decrease in thickness although the gate area of the device is decreased because the coupling ratio between the control electrode and the floating storage electrode must be maintained at about 0.6 or higher. As mentioned above, a large thickness of the floating gate causes an increase in cross-talk between cells, giving rise to an increase in false cell operation and threshold voltage distribution and thus a decrease in production yield.

DISCLOSURE OF INVENTION

Technical Problem

Accordingly, the present invention has been made keeping in mind the above problems occurring in the prior art, and an object of the present invention is to provide a flash memory device structure suitable for a high degree of integration, the distribution of threshold voltage of which is reduced, and the memory capacity and production yield of which are improved.

It is another object of the present invention to provide a flash memory device having a novel floating gate structure capable of increasing the durability thereof and of decreasing cross-talk between cells.

Technical Solution

In order to accomplish the objects, one aspect of the present invention provides a flash memory device, comprising: a tunneling insulation film formed on a semi-conductor substrate; a multilayer floating gate structure comprising a first thin storage electrode, a second thick storage electrode, and a third thin storage electrode, defined in that order on the tunneling insulation film; an interelectrode insulation film and a control electrode formed in that order on the floating gate structure; and a source/drain provided in the semiconductor substrate below the opposite sidewalls of the floating gate structure.

In order to accomplish the objects, another aspect of the present invention provides a flash memory device, comprising: a tunneling insulation film formed on a semi-conductor substrate; a floating gate defined by forming a first thin storage electrode and a second thick storage electrode in that order on the tunneling insulation film; an interelectrode insulation film and a control electrode formed in that order on the floating gate; and a source/drain provided in the semiconductor substrate below the opposite sidewalls of the floating gate.

In order to accomplish the objects, a further aspect of the present invention provides a flash memory device, comprising: a tunneling insulating film formed on a semi-conductor substrate; a floating gate defined by forming a first storage electrode consisting of nano-size dots, a second thick storage electrode, and a third thin storage electrode in that order on the tunneling insulation film; an interelectrode insulation film and a control electrode formed in that order on the floating gate; and a source/drain provided in the semiconductor substrate below the opposite sidewalls of the floating gate.

BRIEF DESCRIPTION OF THE DRAWINGS

FIG. 1 provides schematic cross sectional views showing a flash memory device having a long channel length (a) and a short channel length (b);

FIG. 2 provides plan views showing grains formed in conventional polysilicon floating gates which have a large gate area (a) and a small gate area (b) reduced to ¼ or less;

FIG. 3 is a schematic cross sectional view of a flash memory device according to an embodiment of the present invention;

FIG. 4 is a schematic cross sectional view showing the structure of a flash memory device according to another embodiment of the present invention;

FIG. 5 provides schematic cross sectional views showing the structures of a flash memory device according to a further embodiment of the present invention;

FIG. 6 provides schematic cross sectional views showing the structures of a flash memory device according to yet another embodiment of the present invention;

FIG. 7 shows the flash memory device of FIG. 3 in a 2×2 array form (a), a cross sectional view in the widthwise direction of the channel, taken along line A-A of FIG. 7a (b), and a cross sectional view in the lengthwise direction of the channel, taken along line B-B' of FIG. 7a (c);

FIG. 8 shows the flash memory device of FIG. 3, featuring a reduction in cross-talk between cells in a cell array form (a), a cross sectional view in the widthwise direction of the channel, taken along line A-A' of FIG. 8a (b), and a cross sectional view in the lengthwise direction of the channel, taken along line B-B' of FIG. 8a (c);

FIG. 10 provides schematic cross sectional views showing a modification of the structure of FIG. 3.

BEST MODE FOR CARRYING OUT THE INVENTION

Figure 9:
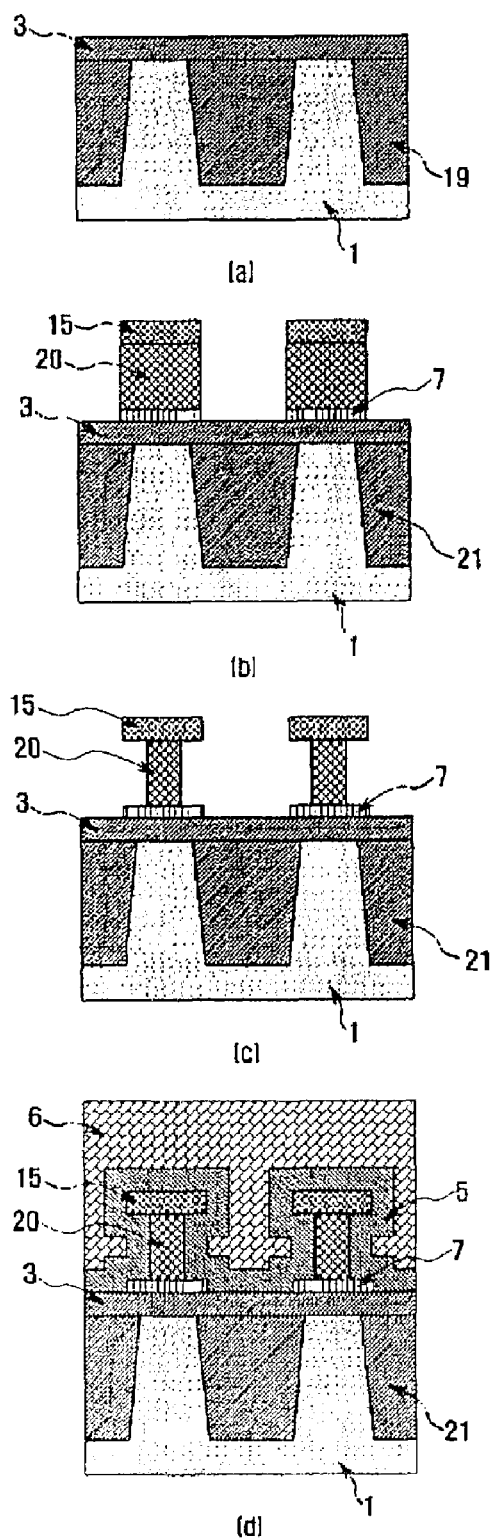
FIGS. 9a to 9d are schematic cross sectional views illustrating processes for fabricating the structure of FIG. 8.

Reference should now be made to the drawings, in which the same reference numerals are used throughout the different drawings to designate the same or similar components. In advance, in order to better understand the background of the present invention, a conventional flash memory device structure is described with reference to FIGS. 1 and 2.

FIG. 1 shows conventional flash memory devices having a long channel length (a) and a short channel length (b) in schematic views, in which a semiconductor substrate (Si substrate) is denoted by region 1, a source/drain by region 2, a tunneling insulation film by region 3, a floating gate (or storage electrode) by region 4, an interelectrode insulating film between the storage electrode and the floating electrode by region 5, and a control electrode by region 6. The floating gate 4 consists of polysilicon, and each grain of the polysilicon is depicted in the drawing. As mentioned above, a reduction in device size results in a decrease in the number of the grains.

With reference to FIG. 2, the floating polysilicon storage electrodes of FIG. 1 are shown in schematic plan views. When the gate has a large area, as seen in FIG. 2a, grains are randomly formed in various crystal directions. For convenience of description, the grains are depicted as having only four crystal directions in FIG. 2. In the case of a large floating gate as in FIG. 2a, different interface charges from different crystal directions can be leveled in one floating gate and the averages of interface charges show a narrow distribution over the entire floating gates. However, when the gate area is reduced to ¼ or smaller as in FIG. 2b, grains in a particular direction may appear to strongly dominate over those in other directions. If so, cells greatly differ in interface charge from one to another. A difference in interface charge between cells leads directly to a difference in threshold voltage. In addition, a difference in interface charge between floating gate electrodes has an influence on the programming/erasing of cells, increasing the threshold voltage after programming/erasing processes. Therefore, decreasing the size of grains in the floating gate results in decreasing the distribution of threshold voltages.

FIG. 3 shows the structure of a flash memory device according to an embodiment of the present invention in a cross sectional view, featuring reduced distribution of threshold voltages through the introduction of a thin polysilicon floating electrode 7 and reduced mechanical stress through a thin polysilicon layer 9. The polysilicon floating electrode 7 ranges in thickness from 0.5 to 30 nm. Between the two thin polysilicon layers, that is, the polysilicon floating electrode 7 and the polysilicon layer 9, is positioned a relatively thick polysilicon layer 8. In light of the architecture of the device, the third storage electrode 9 formed on the second storage electrode 8 plays a role in relieving the mechanical stress caused by the deposition of various films thereon and the stress induced upon thermal treatment. Its thickness falls into a range from 0.5 to 30 nm. Relative to the second storage electrode 8, the first storage electrode 7 and the third storage electrode 9 may be made from polysilicon having a smaller etching ratio (slower etching rate). If so, the second storage electrode 8 may be etched away at the sidewall thereof to form an undercut structure after the definition of the floating electrode, thereby contributing to the reduction of cross-talk between cells. In more detail, after the floating gate is defined, the second storage electrode 8 can be selectively etched at opposite sidewalls thereof to form an undercut narrower than the width of the floating gate, thereby reducing cross-talk between cells. The total thickness of the first, second and third storage electrode 7, 8 and 9 is controlled to maintain the coupling ratio at about 0.5 or higher. As a result, the floating gate has a trilayer structure. The first storage electrode 7 may be made from a material selected from a group consisting of amorphous silicon, amorphous SiGe, polysilicon, and polySiGe. Preferably, the overall thickness of the multilayer structure is on the order of 20 to 200 nm.

Next, a description is given of the formation of the storage electrode 7. In one embodiment according to the present invention, first, a thin layer of amorphous silicon (or amorphous SiGe) is formed at a low pressure on the tunneling insulation film 3, followed by increasing the pressure to atmospheric pressure. After the pressure is again lowered, a layer of polysilicon (or poly-SiGe) is deposited, so that a boundary is formed between the first and the second storage electrode 7 and 8. A subsequent impurity annealing process converts the thin amorphous layer into a polysilicon layer. At this time, if the film is thin, the above-mentioned problems can be solved because the polysilicon layer 7 consists of a number of small grains. Alternatively, after a film is formed for the first storage electrode 7 and the pressure is increased to atmospheric pressure, the sample may be taken out of the chamber for a while and placed therein again to form a boundary surface (grain boundary) between the first and the second storage electrode 7 and 8. In another alternative process, after the formation of the film for the first storage electrode 7, the polysilicon layer of the second storage electrode 8 may be deposited without increasing the pressure by changing the deposition temperature.

In another embodiment according to the present invention, after a polysilicon (poly-SiGe) layer is formed for the first electrode storage 7, the supply of gas for the formation of the film 8 is interrupted for a while at a low pressure and resumed so as to form the thick layer of the second storage electrode 8. In an alternative to this embodiment, after the formation of a thin film of the first storage electrode 7, the pressure may be increased to atmospheric pressure, or the sample may be taken out of the chamber for a while and placed therein again, followed by decreasing the pressure to a value suitable for depositing the polysilicon layer of the second storage electrode 8. Afterwards, the supply of process gas is stopped at a low pressure and then resumed to form a boundary between the second and the third storage electrode 8 and 9. Alternatively, after the formation of the second storage electrode 8, the sample may be taken out of the chamber for a while and then placed therein again to form the third storage electrode 9, thereby providing a boundary between the second and the third storage electrode 8 and 9. In another alternative, the sample may be taken out of the chamber for a while just after the formation of the second storage electrode 8, and then placed therein again to form the third storage electrode 9 to thus create the boundary. In order to form the third storage electrode 9 to the thickness mentioned above, the same amorphous silicon layer as in the first storage electrode 7 may be formed and then converted into a polysilicon layer through heat treatment, thereby forming a number of grains that are as small as possible. The third storage electrode 9 serves to absorb the stresses created by the layers formed thereon, that is, the insulation layer and the control electrode, and thus can increase the durability of the device. Having many grain boundaries in a given volume, small grains can absorb mechanical stress well. In addition, small grains make the upper corners of the floating gate smooth, thus improving the durability of the interelectrode insulation film.

With reference to FIG. 4, a modification of the device structure of FIG. 3 is shown in a schematic cross-sectional view, featuring a floating gate consisting of two polysilicon layers 7 and 10. The lower polysilicon layer 7 has a thickness from 0.5 to 30 nm while the upper polysilicon layer 10 is 20~150 nm thick. The role and formation process of a fourth storage electrode 10 is the same as that described in FIG. 3. Preferably, the overall thickness of the floating gate is on the order of 20 to 200 nm.

FIG. 5a and 5b show device structures corresponding to those of FIGS. 3 and 4, respectively, featuring the introduction of a second control electrode 14 underneath the control electrode 6. A second control electrode 14 is formed in the same manner as in the first storage electrode 7, and consists of a number of small grains suitable for absorbing the mechanical stresses generated during the fabrication process. The introduction of the second control electrode 14 consisting of many small grains may increase the durability of the interelectrode insulation film.

FIGS. 6a and 6b show device structures corresponding to those of FIGS. 5a and 5b, respectively, featuring a multilayer floating electrode. As seen in the drawing, the floating gate has a pentalayer structure 7/11/12/13/9. These layers may be identical to or different from one another in thickness and may be made from poly-Si or poly-SiGe. Ranging in thickness from 1 to 30 nm, each of the layers has a number of small grains. The first and the third storage electrode 7 and 9 have the same thicknesses and play the same respective roles as described in FIG. 3.

With reference to FIG. 7, the device described in FIG. 3 is shown in a 2×2 array form (a), in a cross sectional view in the widthwise direction of the channel, taken along line A-A' of FIG. 7a (b), and in a cross sectional view in the lengthwise direction of the channel, taken along line B-B'(c). Cross-talk between cells is generated predominantly in the lengthwise direction of the channel, as shown in FIG. 7c. In these figures, an STI (Shallow Trench Isolation) region for isolating elements is denoted by region 21. In order to relieve stress, a thin nitride film may be formed on the STI region in the area where an isolating oxide film is in contact with the silicon substrate, with a thin insulation film interposed between the silicon substrate and the nitride film.

With reference to FIG. 8, a device structure which features reduced cross-talk between cells because an additional storage electrode 20 is introduced and used, is shown in a cell array form (a), in a cross sectional view in the widthwise direction of the channel, taken along line A-A' of FIG. 8a (b), and in a cross sectional view in the lengthwise direction of the channel, taken along line B-B' of FIG. 8a (c).

The device structure of FIG. 8 comprises a first storage electrode 7, as in FIG. 3, in order to decrease the distribution of threshold voltage, and a floating gate having an area significantly reduced in the widthwise direction of the channel in order to reduce cross-talk between cells. On the same first storage electrode 7, made from polysilicon, as described in FIG. 3, is formed a material which has a larger dry or wet etching ratio than that of the first storage electrode 7 or an eighth storage electrode 15, to be described later. Next, the eighth storage electrode 15, which functions like the third storage electrode 9 described in FIG. 3, and a ninth storage electrode 20 are formed in order over the polysilicon layer of the first storage electrode 7. As seen in FIG. 8b, the ninth storage electrode 20 is selectively etched to shape the floating gate in an undercut form such that not only can the coupling ratio between the control electrode and the floating electrode be suitably maintained, but the cross-talk between cells can also be reduced.

SiGe is a material suitable for the ninth storage electrode 20. This material can make the fabrication process simple because its dry or wet etching ratio to polysilicon can be controlled simply by changing the Ge content. The eighth storage electrode 15 has a small thickness and is formed of polysilicon using a process similar to that described in FIG. 3. Also, the first storage electrode 7 is formed in the same manner as described in FIG. 3, and the ninth storage electrode 20 is deposited as an amorphous or poly-SiGe layer on the ninth storage electrode 20. The boundary between the first and the ninth storage electrode 7 and 20 can be realized using the method according to the first or the second embodiment described in FIG. 3. Following the formation of the ninth storage electrode 20, a polysilicon or amorphous silicon layer is deposited to form the eighth storage electrode 15 on the ninth storage electrode 20. When amorphous silicon is deposited, heat treatment is conducted to convert the amorphous silicon into polysilicon with small grains formed therein. In order to define the boundary between the ninth and the eighth storage electrode 20 and 15, gas supply for the eighth storage electrode 15 is stopped temporarily, or the pressure is increased and then decreased with the sample maintained within the chamber, after the formation of the ninth storage electrode 20. Alternatively, the sample is taken out of the chamber for a while and then placed again in the chamber before the deposition of the eighth storage electrode 15.

FIG. 9 shows main process steps for fabricating the structure of FIG. 9. After the formation of an STI region, a tunneling insulation film 3 is formed as shown in FIG. 9a. Next, a first storage electrode 7, a ninth storage electrode 20 and an eighth storage electrode 15. are constructed in that order on the tunneling insulation film 3, followed by dividing the floating gate using a photolithographic technique, as shown in FIG. 9b. Optionally, a protective insulation film is formed atop the eighth storage electrode. Having a dry or wet etching ratio greater than that of the amorphous silicon or polysilicon for the first storage electrode 7 and the eighth storage electrode 15, the poly-SiGe for the ninth storage electrode is selectively etched under given conditions, as shown in FIG. 9c. After a suitable cleansing process and a surface treatment process, an interelectrode insulation film 5 is formed over the resulting structure, and then a blanket of a material for a control electrode is deposited thereon, as shown in FIG. 9d. Because the control electrode in the undercut region may be apt to cause a short circuit, as shown in FIG. 9d, a damascene process or a conventional method may be used to form the control electrode.

FIGS. 10a and 10b show device structures modified from those suggested in FIGS. 3 and 4, respectively, in cross sectional views. Whereas small grains are generated in the first storage electrode 7 in the structure of FIG. 3, they are formed from a combination of nano-size dots and a polysilicon layer deposited thereon. Each of the dots has a size from 2 to 20 nm with a gap of 30 nm or smaller therebetween. Over the dots is formed a polysilicon or amorphous silicon layer using the same process for forming the boundary as in FIG. 3. A third storage electrode 9 consisting of polysilicon having 0.5-30 nm size grains is formed over the nano-size dot storage electrode 22 and the second storage electrode 8 in the floating gate. The total thickness of these layers is on the order of 20 nm-200 nm.

INDUSTRIAL APPLICABILITY

As described hereinbefore, the present invention provides a novel flash memory device structure, in which the distribution of threshold voltage is significantly reduced upon programming/erasing the memory device, and the durability of which is improved.

Particularly, a large number of grains is provided in a given gate area by constructing a multilayer floating gate structure and reducing the size of the grains of the floating gate, which is in contact with the tunneling insulation film, so that the characteristics determined according to the crystal directions of the grains are leveled among the cells, thereby reducing the distribution of threshold voltage.

Therefore, the novel flash memory device of the present invention, which has a low distribution of threshold voltage and shows high durability, can be readily fabricated at a high yield in a process compatible with a conventional one.

The invention claimed is:

1. A flash memory device, comprising:
a tunneling insulation film formed on a semiconductor substrate;
a multilayer floating gate structure formed on the tunneling insulation film;
an interelectrode insulation film and a multilayer control electrode structure formed in order on the floating gate structure; and
a source/drain provided in the semiconductor substrate below opposite sidewalls of the floating gate structure,
wherein the multilayer floating gate structure comprising a first storage electrode, a second storage electrode, and a third storage electrode,
the second storage electrode is made from a material having a high etching ratio compared to that of the first or the third storage electrode, and is etched, after defining the floating gate structure, at opposite sidewalls thereof to form an undercut narrower than the entire floating gate structure, thereby reducing cross-talk between cells.

2. A flash memory device, comprising:
a tunneling insulating film formed on a semiconductor substrate;
a floating gate defined by forming a first storage electrode consisting of nano-size dots, a second thick storage electrode, and a third thin storage electrode in that order on the tunneling insulation film;
an interelectrode insulation film and a control electrode formed in that order on the floating gate; and
a source/drain provided in the semiconductor substrate below the opposite sidewalls of the floating gate.

3. The flash memory device as set forth in claim 2, wherein the third storage electrode, formed over the first and the second storage electrode, consists of polysilicon having grains ranging in size from 0.5 to 30 nm.

4. A flash memory device, comprising:
a tunneling insulation film formed on a semiconductor substrate;
a multilayer floating gate structure formed on the tunneling insulation film;
an interelectrode insulation film and a multilayer control electrode structure formed in order on the floating gate structure; and
a source/drain provided in the semiconductor substrate below opposite sidewalls of the floating gate structure,
wherein the control electrode is a multilayer structure, a bottom layer of the multilayer structure ranges in thickness from 0.5 to 30 nm and is made from polysilicon.

* * * * *